(12) United States Patent
Bardia et al.

(10) Patent No.: US 8,338,721 B2
(45) Date of Patent: Dec. 25, 2012

(54) COVER WITH IMPROVED VIBRATIONAL CHARACTERISTICS FOR AN ELECTRONIC DEVICE

(75) Inventors: Prashant Bardia, Madhya Pradesh (IN); Rahul Patil, Maharashtra (IN); Amir Osmani, Andhra Pradesh (IN); Lee A. Johnson, Fargo, ND (US)

(73) Assignee: Phoenix International Corporation, Fargo, ND (US)

( * ) Notice: Subject to any disclaimer, the term of this patent is extended or adjusted under 35 U.S.C. 154(b) by 299 days.

(21) Appl. No.: 12/762,514

(22) Filed: Apr. 19, 2010

(65) Prior Publication Data

US 2011/0240361 A1 Oct. 6, 2011

Related U.S. Application Data

(60) Provisional application No. 61/320,002, filed on Apr. 1, 2010.

(51) Int. Cl.
*H01R 13/502* (2006.01)
(52) U.S. Cl. .......................................... 174/560; 174/66
(58) Field of Classification Search .................. 174/377, 174/382, 384, 520, 66, 560; 361/816; 257/704
See application file for complete search history.

(56) References Cited

U.S. PATENT DOCUMENTS 3,346,221 A * 10/1967 Farmer ..................... 267/140.13
4,579,022 A 4/1986 Kasai et al.
4,589,713 A 5/1986 Pfuhl et al.
4,635,940 A 1/1987 Kelley
4,640,402 A 2/1987 Hartig et al.
4,891,468 A * 1/1990 Andrae ......................... 174/392
5,089,794 A * 2/1992 Norimatsu ..................... 331/68
5,212,607 A 5/1993 Elsing et al.
5,295,027 A 3/1994 Elsing et al.
6,188,150 B1 2/2001 Spence
6,282,092 B1 8/2001 Okamoto et al.
6,628,523 B2 9/2003 Kobayashi et al.
6,700,068 B2 * 3/2004 Hoffmeyer et al. ........... 174/250
6,707,678 B2 3/2004 Kobayashi et al.
6,717,051 B2 4/2004 Kobayashi et al.
6,816,381 B2 11/2004 Takeuchi
6,965,492 B2 11/2005 Obata et al.
7,184,273 B2 2/2007 Sakai
7,476,992 B2 1/2009 Rutsyamuka
2008/0291646 A1 11/2008 Fino et al.
2009/0308653 A1* 12/2009 Wu ............................... 174/377

FOREIGN PATENT DOCUMENTS

DE        19926756       12/1999

* cited by examiner

*Primary Examiner* — Hung Ngo

(57) ABSTRACT

A cover or housing member for an electronic device comprises a central region and a perimeter region surrounding the central region. The central region comprises an elevated pattern of radial ribs and elliptical elevations elevated above a generally planar lower surface, such that the cover has multiple vibrational modes of natural resonance in which a maximum deflection of the cover occurs in a first mode at a central point of the cover.

20 Claims, 8 Drawing Sheets

First Mode of Vibration

Second Mode of Vibration

Third Mode of Vibration

COVER WITH IMPROVED VIBRATIONAL CHARACTERISTICS FOR AN ELECTRONIC DEVICE

CROSS REFERENCE TO RELATED-APPLICATION

This document claims priority based on U.S. provisional application No. 61/320,002, filed on Apr. 1, 2010, and entitled COVER WITH IMPROVED VIBRATIONAL CHARACTERISTICS FOR AN ELECTRONIC DEVICE, under 35 U.S.C. 119(e).

FIELD OF THE INVENTION

This invention relates to a cover or housing member with improved vibrational characteristics or dampening for an electronic device.

BACKGROUND OF THE INVENTION

An electronic device is sometimes subject to vibration during use which has the potential to damage an electronic component or a circuit board of the device through mechanical fatigue, shock, air pressure changes, or otherwise. If the electronic device is mounted in a ground vehicle or an off-road ground vehicle, the vehicle and the electronic device may experience the greatest amplitude of vibration between approximately zero and two thousand cycles per second (Hertz). A cover is attached or secured to the electronic device. Accordingly, there is a need for a cover or housing member with improved vibrational characteristics or dampening of vibration for an electronic device to decrease the mechanical stress on the electronic device.

SUMMARY OF THE INVENTION

In accordance with one embodiment, a cover or housing member for an electronic device comprises a central region and a perimeter region surrounding the central region. The central region comprises an elevated pattern of radial ribs and elliptical elevations elevated above a generally planar lower surface, such that the cover has multiple vibrational modes of natural resonance in which a maximum deflection of the cover occurs in a first mode at a central point of the cover. The cover or housing member can be mounted or secured to the housing such that the cover is spaced apart from a circuit board in the electronic device with a predetermined clearance dimension. The cover or housing member is well-suited for dampening vibrational energy for the electronic device to support longevity and reliability of the device and its electrical and electronic components.

DESCRIPTION OF THE PREFERRED EMBODIMENTS

Figure 1:
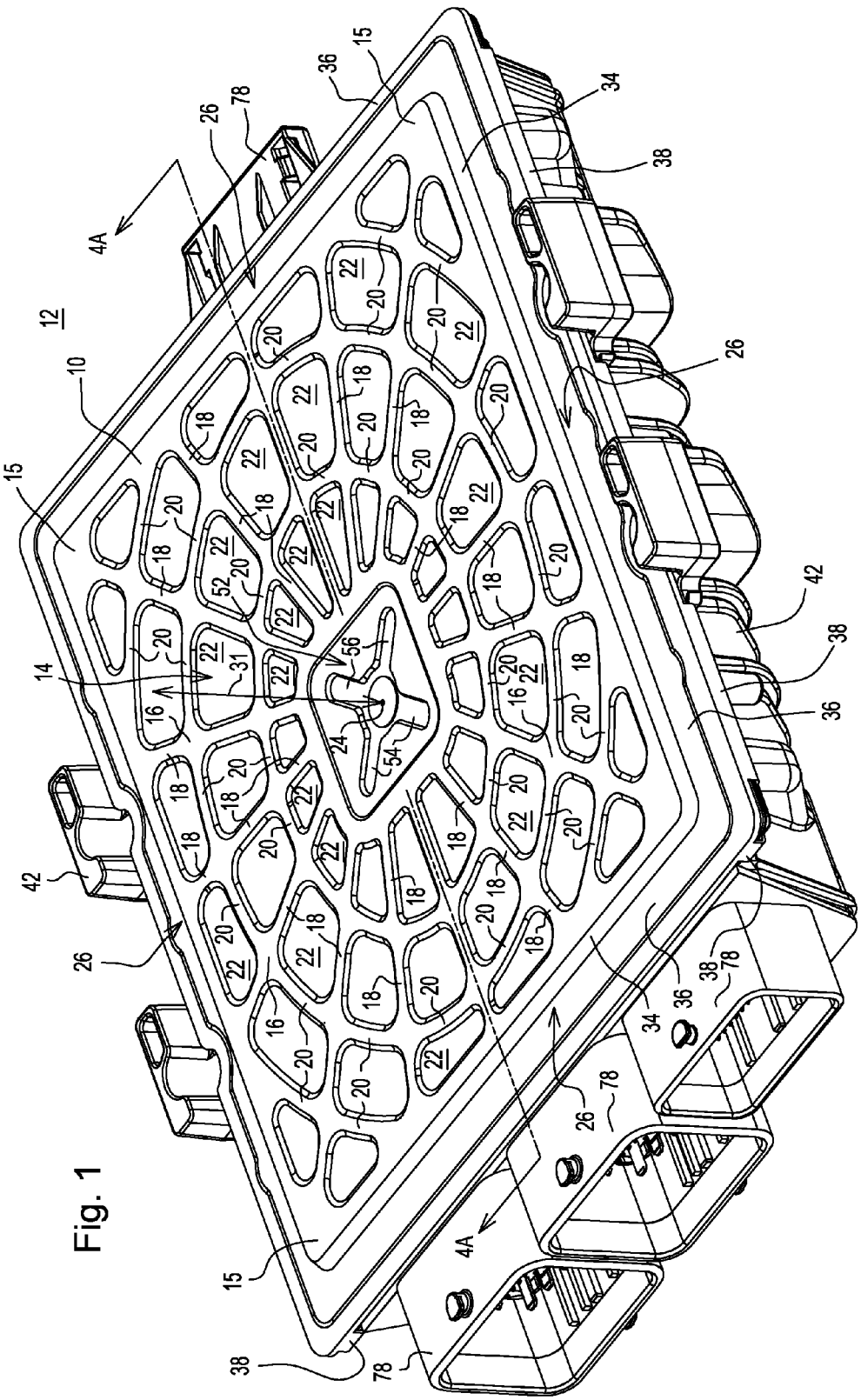
FIG. 1 is a perspective view of the cover or housing member mounted on an electronic device in accordance with a first vibrational mode.

In accordance with one embodiment, in FIG. 1 a cover 10 or housing member for an electronic device 12 comprises a central region 14 and a perimeter region 26 surrounding the central region 14. The central region 14 comprises an elevated pattern 16 of radial ribs 18 and elliptical elevations 20 elevated above a generally planar lower surface 22. As used herein, a generally planar surface shall include any of the following: a perfectly flat or planar surface, a virtually flat or planar surface, a substantially flat or planar surface, a surface that has immaterial changes in elevation between two reference points on or associated with the surface such that the two reference points do not truly lie in the exact same geometric plane as the surface, or a surface that has an immaterial slope (e.g., less than 1 millimeter in maximum elevation change per centimeter in radial displacement) between a reference point and any radially spaced point on a generally planar surface.

The elevated pattern 16 is arranged such that the cover 10 has multiple vibrational modes of natural resonance (e.g., at corresponding natural resonant frequencies) in which a maximum deflection or maximum elastic deformation of the cover 10 occurs in each vibrational mode (e.g., first mode at a central point 24) of the cover 10. The cover 10 or housing member is configured with the elevated pattern 16 to dampen vibration encountered by the electronic device in on-road ground vehicle applications, off-road ground vehicle applications, or otherwise. Further, the cover 20 may have vibrational modes that are tuned, via the arrangement of the elevated pattern 16, to dissipate vibrational energy and to increase the natural frequency of resonance over that of a cover or housing member having a generally planar surface. Each mode of vibration for the cover 10 may be associated with a different natural frequency of vibration or a range of different natural frequencies of vibration.

In one embodiment, the perimeter region 26 has a step 34 and a mating flange 36 for mating with the electronic device 12. As illustrated in FIG. 1, the edge of the perimeter region 26 terminates in a lip 38 extending in an opposite direction (e.g., downward in FIG. 1) from the elevated pattern 16. In one configuration, the central region 14 is generally rectangular, although the central region 14 may be shaped with other geometric shapes, such as substantially polygonal, circular, elliptical, or otherwise.

Figure 4A:
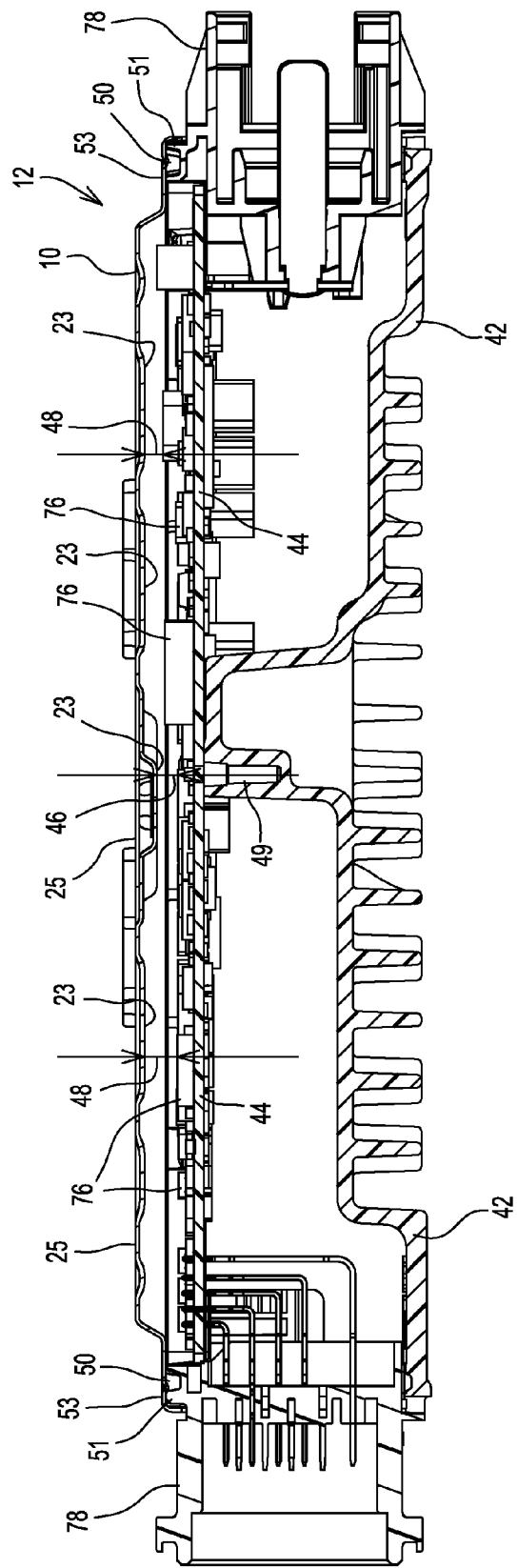
FIG. 4A is a perspective view of a cross section of the electronics device along reference line 4A-4A of FIG. 1.

The radial ribs 18 and elliptical elevations 20 of the elevated pattern 16 are spaced apart from each other (or arranged with a target density) to achieve the desired maximum deflection or other vibrational characteristics of the cover 10. The deformation or deflection of the cover 10 is generally elastic and does not result in permanent deformation of the cover 10. As illustrated in FIG. 4A, the desired maximum deflection or elastic deformation may depend upon or comply with a clearance distance 46 between a circuit board 44 or closest component mounted on the circuit board 44 and the interior side 23 of the cover 10. The exterior side 25 of the cover 10 is opposite the interior side 23. The vibrational characteristics are defined by one or more of the following, among other possible factors: (a) the maximum deflection or elastic deformation of the cover 10 mounted on an electronic device 12 at or near the perimeter region 26, (b) natural frequency or frequencies of vibration of the cover 10 in a vibrational mode associated with vibrational excitation typical of off-road vehicles, on-road vehicles, or both, (c) increasing the natural frequency of vibration of the cover 10 in one or more vibrational modes by adding structural rigidity to the cover 10 associated with the elevation pattern (e.g., 16), and (d) the dominant vibrational modes of the cover 10 and the corresponding maximum deflection or maximum elastic deformation associated with each dominant vibrational mode in response to vibrational excitation in a frequency range (e.g., approximately zero to two thousand Hertz) and of an amplitude level associated with off-road vehicles.

As shown in FIG. 1, the radial ribs 18 are positioned approximately twenty two and one-half degrees apart from each other, although other spacing may provide desired structural rigidity of the cover 10 and vibrational characteristics. Although sixteen radial ribs 18 are illustrated in FIG. 1, any other number of radial ribs 18 may be used that provides the desired structural rigidity and vibrational characteristics.

Although there are two elliptical elevations 20 that are generally concentric about a center point 24 in FIG. 1, any other number of elliptical elevations 20 may be used to achieve the desired vibrational characteristics in conjunction with the radial ribs 18. Because of the generally rectangular shape of the cover 10, the outermost elliptical elevations 20 near corners 15 are shaped like arcs or are partially elliptical. The inner-most elliptical elevations 20 surround the central portion 52.

As illustrated in FIG. 1, the center point 24 lies within the central portion 52. The central portion 52 is generally rectangular and has a depressed region 54 that has two generally linear depressed sections 56 that cross each other.

In one embodiment, the elevated pattern 16 is formed by stamping a generally planar sheet metal or alloy with or against a die. In one embodiment, the planar sheet metal may comprise steel, a stainless steel alloy or another metal or alloy. In an alternative embodiment, the cover may be formed of another material, such as a polymer, a polymer composite, a plastic, a polymer matrix with a filler (e.g., carbon fiber), or otherwise. In one configuration, the radial ribs 18 and elliptical elevations 20 are within a range of approximately 1 millimeter to approximately 3 millimeters above the generally planar lower surface 22.

Figure 5A:
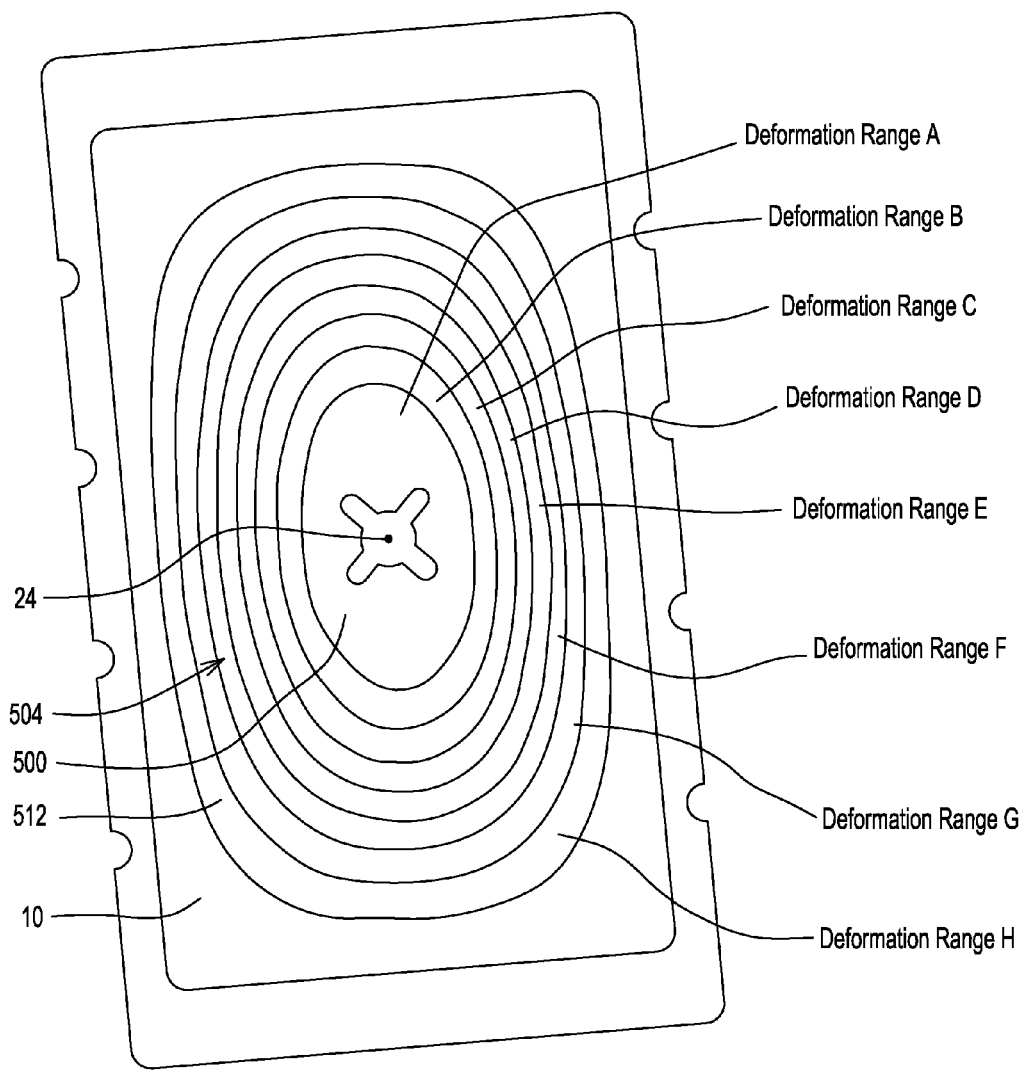
FIG. 5A through FIG. 5C, inclusive, illustrate examples of deformation patterns of the cover or housing member in three different vibrational modes.

The first vibrational mode is illustrated by the double-headed arrow 31 in FIG. 1 at the central point 24. The first mode of vibration of the cover 10 may be excited by any excitation frequency or excitation frequency range (e.g., within a range between zero and two thousand Hertz), although the first mode may be more readily or efficiently excited with an excitation frequency or excitation frequency range that is a positive integer multiple of a natural frequency of resonance or vibration of the first mode, which is elevated above the frequency of natural resonance of a generally planar cover. The double-headed arrow 31 indicates that the central point 24 of the cover 10 can move or be deflected up or down by the maximum deflection (e.g., absolute maximum deflection or maximum elastic deformation) or maximum first mode deflection that is specific to the first mode. In the first mode, the cover 10 may oscillate with a first mode frequency (e.g., maximum first mode frequency), which is generally higher than that of a generally planar or reference flat cover, in response to excitation by ground induced vibrations of an off-road or on-road vehicle. FIG. 5A shows the first mode in greater detail than FIG. 1 and will be described later in this document.

The lower the frequency of natural resonance of the cover 10 or housing member, the higher the energy in that resonance. Therefore, the elevated pattern 16 is configured to shift the natural resonance of the cover 10 higher in the frequency range for one or more of the vibrational modes. Even a small increase in the first mode frequency, the second mode frequency or the third mode frequency of vibration (e.g., where the mode frequency comprises the frequency of natural resonance) from the design of the elevated pattern 16 may reduce the maximum deflection (e.g., of the cover 10 toward the circuit board 44) and the vibrational energy that the electronic device 12 or the circuit board 44 are exposed to.

Figure 2:
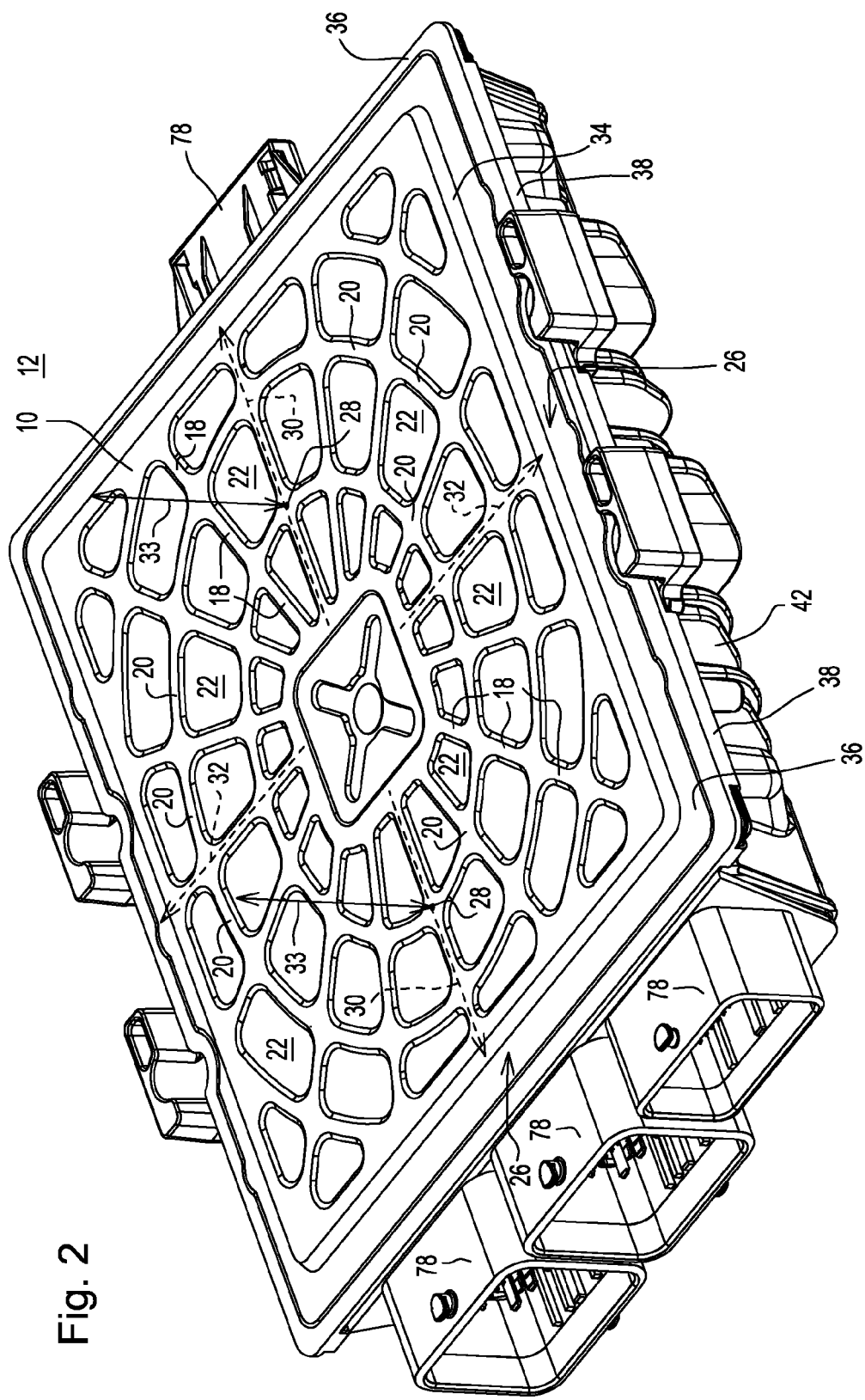
FIG. 2 is a perspective view of the cover mounted on an electronic device in accordance with a second vibrational mode.

FIG. 2 is similar to FIG. 1, except the double-headed arrows 33 show the illustrative natural vibration in the second mode, as opposed to the first mode of FIG. 1. Like reference numbers in FIG. 1 and FIG. 2 indicate like elements. The second mode of vibration of the cover 10 may be excited by any excitation frequency or excitation frequency range (e.g., within a range between zero and two thousand Hertz), although the second mode may be more readily or efficiently excited with an excitation frequency or excitation frequency range that is a positive integer multiple of a natural frequency of resonance or vibration of the second mode, which is elevated above the frequency of natural resonance of a generally planar cover. The double-headed arrows 33 are arranged about the longitudinal axis 30 which extends longitudinally parallel to the longer side of the generally rectangular cover 10. The double headed arrows 33 indicate the region of maximum deflection or maximum elastic deformation of the natural resonance or vibration in the second mode. The double-headed arrows 33 indicate the region or point of maximum displacement (e.g., vertical displacement) of the cover 10 with respect to the circuit board 44 in the second mode. The doubled-headed arrows intercept the longitudinal axis 30 and two second mode deflection points 28.

Figure 3:
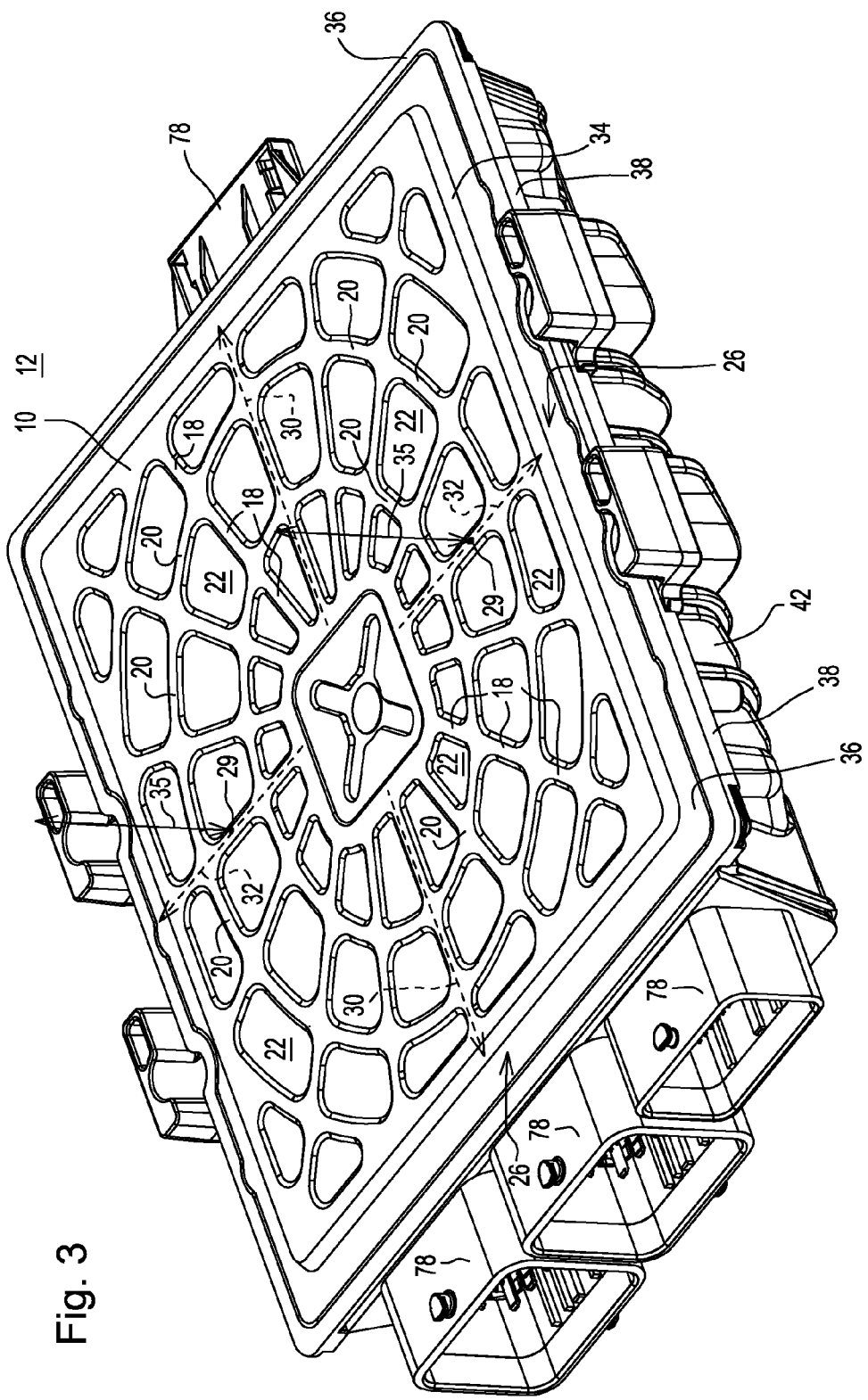
FIG. 3 is a perspective view of the cover mounted on an electronic device in accordance with a third vibrational mode.

FIG. 3 is similar to FIG. 1 and FIG. 2, except the double-headed arrows 35 show the illustrative natural vibration in the third mode, as opposed to the first mode of FIG. 1 or the second mode of FIG. 2. Like reference numbers in FIG. 1, FIG. 2, and FIG. 3 indicate like elements. The third mode of vibration of the cover 10 may be excited by any excitation frequency or excitation frequency range (e.g., within a range between zero and two thousand Hertz), although the third mode may be more readily or efficiently excited with an excitation frequency or excitation frequency range that is a positive integer multiple of the natural frequency of resonance or vibration of the third mode, which is elevated above the frequency of natural resonance of a generally planar cover. The double-headed arrows 35 are arranged about the transverse axis 32 that is perpendicular to the longitudinal axis 30. As described above, the longitudinal axis 30 extends longitudinally parallel to the longer side of the generally rectangular cover 10. The double headed arrows 35 indicate the region of maximum deflection or elastic deformation of the natural resonance or vibration in the third mode. The double-headed arrows 35 indicate the region or point of maximum displacement of the cover 10 with respect to the circuit board 44 in the third mode. The doubled-headed arrows 35 intercept the transverse axis 32 and two third mode deflection points 29.

FIG. 4A is a perspective view of a cross section of the electronics device that is cut-away along reference line 4A-4A of FIG. 1. Like reference numbers in FIG. 1 and FIG. 4A indicate like elements.

Figure 4B:
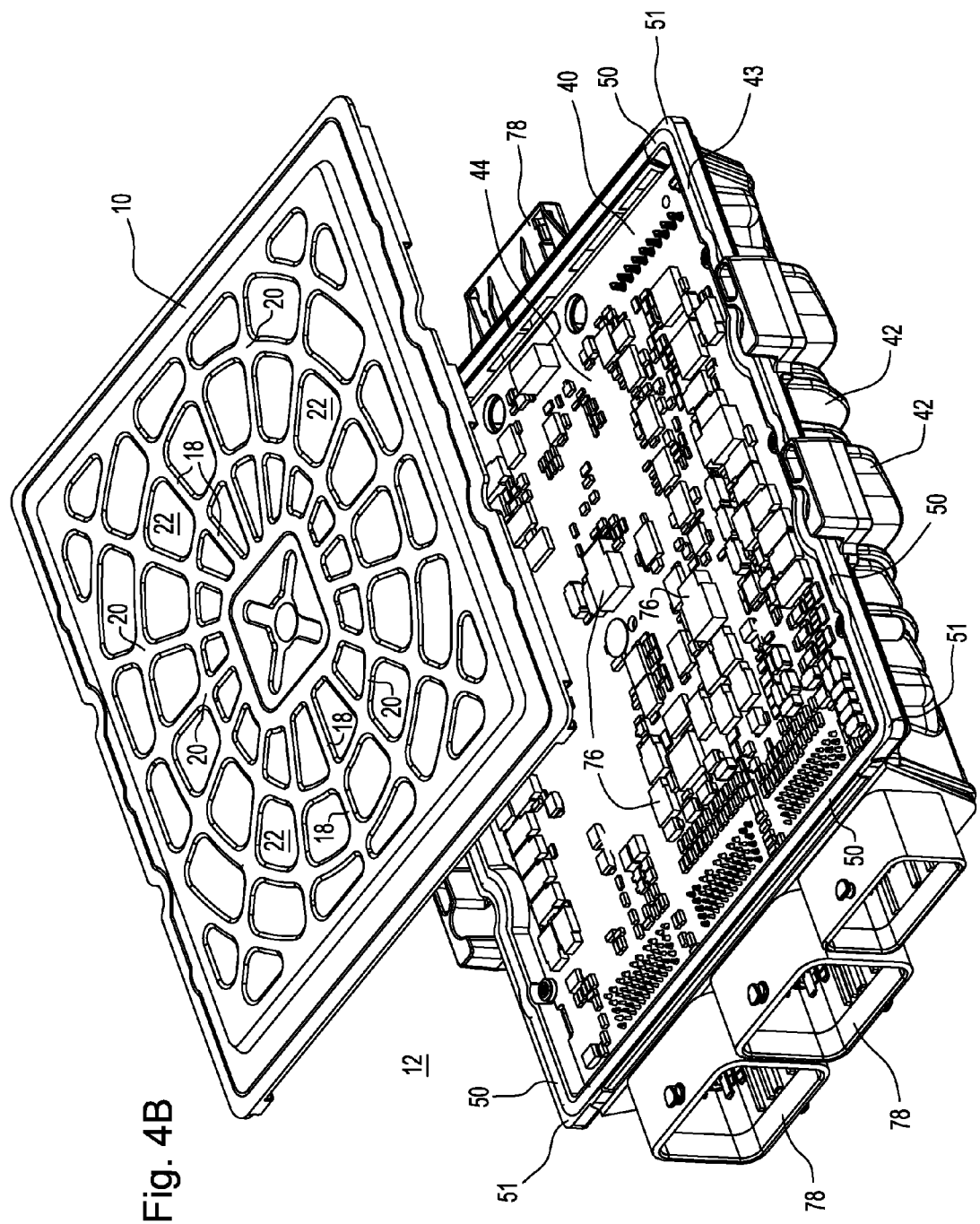
FIG. 4B is a perspective exploded view of the electronics device with the cover removed to reveal an open side of the housing.

As illustrated in FIG. 4A and FIG. 4B, an electronic device 12 comprises a housing 42 having at least one open side 40. A circuit board 44 is secured to or within the housing 42. For example, the circuit board 44 may be mounted to the housing 42 via fasteners (e.g., screws) or via fasteners and stand-offs. As illustrated in FIG. 4A, the circuit board 44 is attached to the housing 42 via a centrally mounted screw 49, although numerous other mounting techniques are possible including, but not limited to, fasteners, clips, adhesives, retainers, card-edge retainers, or snap-fit connections.

The cover 10 or housing member is arranged for mating with the open side 40 of the housing 42. When mounted on the housing 42, the cover 10 or housing member is spaced apart from the circuit board 44 or the closest portion (e.g., highest elevation) of the components mounted thereon by a clearance distance 46. The cover 10 comprises a central region 14 and a perimeter region 26. The central region 14 comprises an elevated pattern 16 of radial ribs 18 and elliptical elevations 20 elevated above a generally planar lower surface 22. The elevated pattern 16 is arranged such that the cover 10 has multiple vibrational modes of natural resonance, including a first vibrational mode, a second vibrational mode, and a third vibrational mode, for example.

In a first mode (e.g., at a first mode vibrational frequency or frequency range of natural resonance for a given excitation energy), a maximum deflection of the cover 10 occurs at a central point 24 of the cover 10, where the maximum deflection is less than the clearance distance 46 between the interior side 23 of the cover 10 and the circuit board 44 or components 76 mounted thereon. The clearance distance 46 of the first mode may be aligned with or coincident with the double-headed arrow 31 and the central point 24 of FIG. 1.

The clearance distance or distances 48 of the second mode (e.g., at a second mode vibrational frequency or frequency range of natural resonance for a given excitation energy) may be aligned with or coincident with the double-headed arrow 33 of the second mode and the deflection points 28 of FIG. 2. Each clearance distance 48 is between the interior side 23 of the cover 10 and the circuit board 44 or components 76 mounted thereon The clearance distance (not shown) of the third mode may be aligned with or coincident with the double-headed arrow 35 of the third mode and deflection points 29 of FIG. 3. The clearance distance of the third mode (e.g., at a third mode vibrational frequency or frequency range of natural resonance for a given excitation energy) is between the interior side 23 of the cover 10 and the circuit board 44 or components 76 mounted thereon Movement (e.g., vertical movement) of the cover 10 interior toward the circuit board 44 even as small as two millimeters to three millimeters can cause the circuit board 44 to resonate, which in turn can cause fragile components, like ceramic capacitors to crack or fracture. Under one possible failure mode or reliability-reducing mode of the circuit board 44 that might occur in the absence of improved cover 10 set forth herein, the circuit board 44 might be moved by the rapid movement of air between the alternate cover (e.g., an alternate cover that is a substantially flat or planar cover) the circuit board 44 as the alternate cover vibrates. The electronic device 12 may have the interior side 23 of the cover 10 as close as possible to the circuit board 44 with a clearance distance that is greater than or equal to the maximum deflection of the cover 10. The close spacing of the cover 10 to the circuit board 44 allows the electronic device 12 to have a compact height or low profile that is useful for mounting the electronic device 12 in cramped vehicle compartments or in other parts of the vehicle (e.g., such as in the headliner in the vehicle cab).

FIG. 4B is a perspective exploded view of the electronics device 12 with the cover 10 or housing member removed to reveal an open side 40 of the housing 42 and the circuit board 44 mounted or secured within the housing 42. A seal 50 may intervene between a housing mating surface 51 and the mating surface 53 of the cover 10 or lid. The seal 50 may comprise a gasket, sealant, an adhesive, or another material for preventing the ingress of moisture, salt, fog, rain, precipitation, dirt, debris, dust or other contaminants from the external environment into the housing 42 or the circuit board 44 therein.

FIG. 4B illustrates components 76, such as electronic components, electrical components (e.g., capacitors), semiconductors (e.g., integrated circuits), or other devices mounted on the circuit board 44. Electrical connectors 78 on the sides of the housing 42 support one or more electrical connections to the circuit board 44, conductive traces thereon, or components 76 thereon.

Figure 5B:
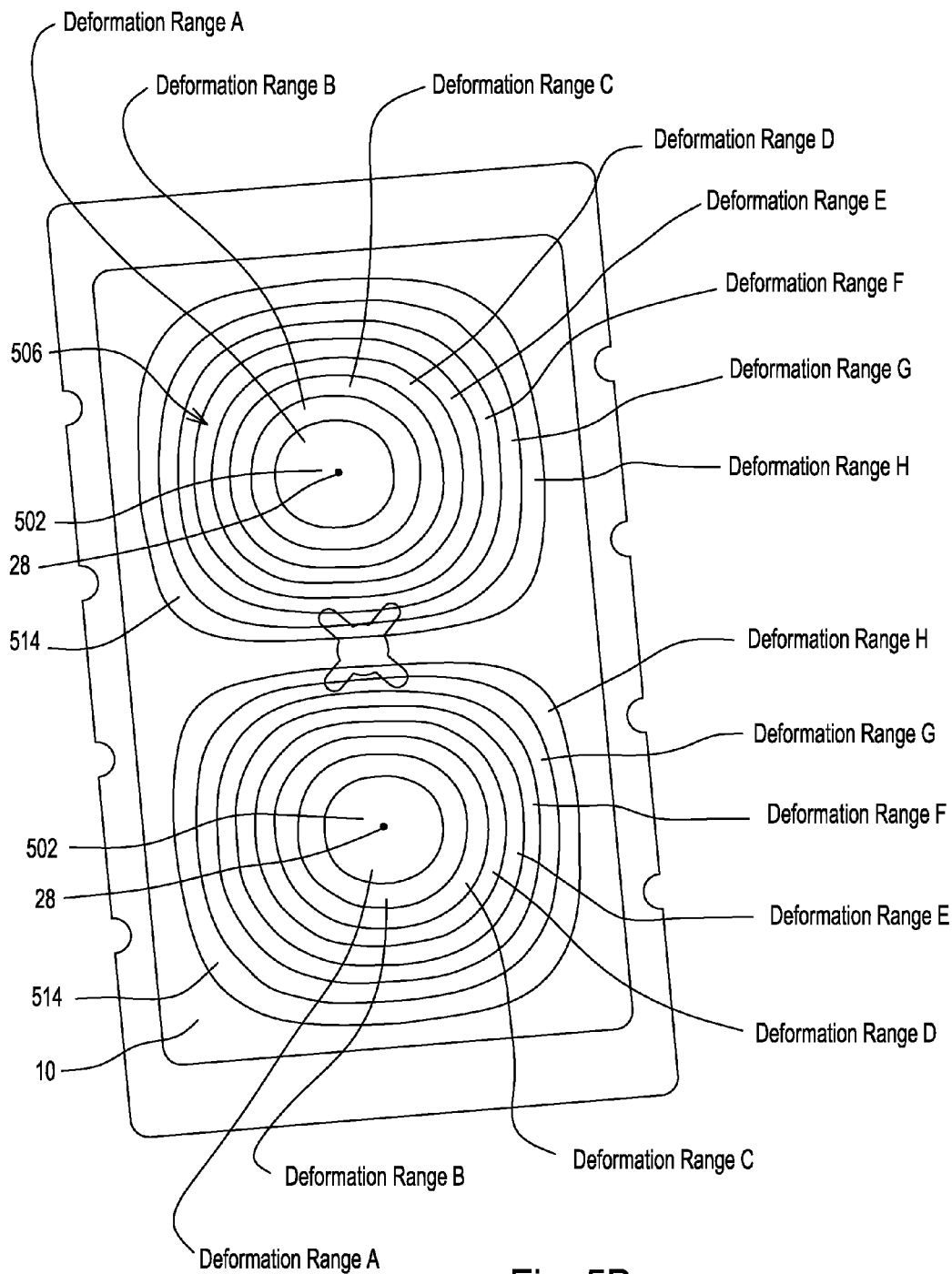
Figure 5C:
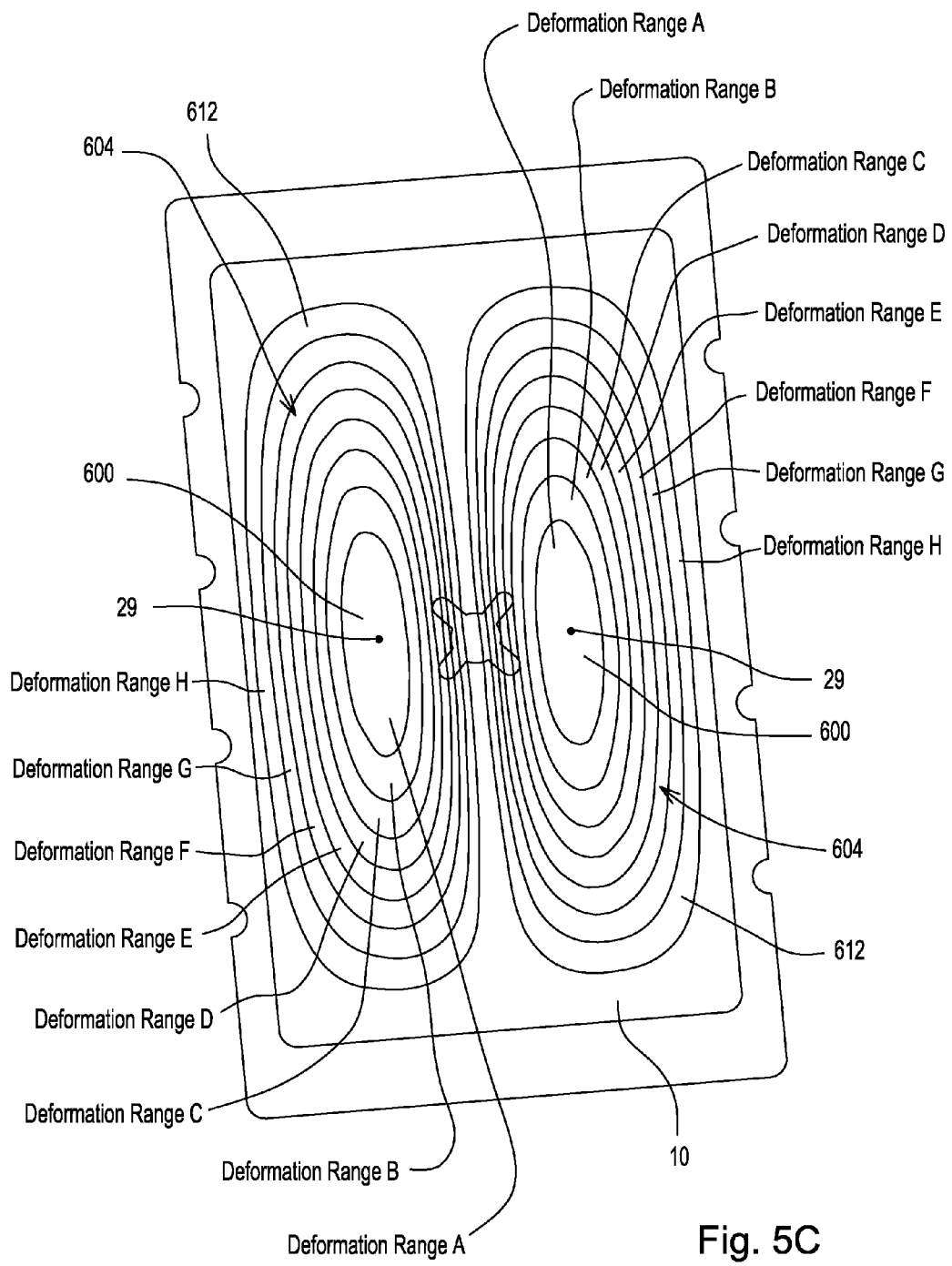

Although the measurement units for the elastic deformation patterns in FIG. 5A through FIG. 5C, inclusive, are set forth in micrometers (i.e., $\mu m$) for illustrative purposes, it should be understood that the units are somewhat arbitrary and will change with the magnitude or amplitude of the excitation energy (e.g., at one or more excitation frequencies) that vibrates the cover 10 or the electronic device 12. To some extent, the greater the amplitude of the excitation vibrational energy applied to the cover 10 or electronic device 12, the greater the magnitude of the elastic deformation of the cover 10 tends to be, at least to a limit. As illustrated, FIG. 5A through FIG. 5C, inclusive, use a common amplitude or common reference excitation energy at different excitation frequencies for the sake of ready comparison.

In various embodiments of cover or electronic device, the measurement units or illustrative deformations in FIG. 5A through FIG. 5C, inclusive, may vary with one or more of the following: the magnitude, frequency or frequencies, waveform (e.g., sinusoidal excitation) and other parameters of the input vibrational energy applied to the cover 10; the thickness of the sheet metal, alloy, polymer, polymer composite or other material used to construct the cover 10; the elasticity or other material properties of the sheet metal, alloy, polymer, polymer composite or other material for the cover 10; the points of attachment (e.g., peripheral attachment or peripheral and central attachment) of the cover to the housing 42 of the electronic device; the height of the elliptical elevations and radial ribs on the cover 10; and the number or density of elliptical elevations or radial ribs on the cover 10, among other possible factors that fall within the scope of the claims.

In FIG. 5A, the cover 10 has a first mode of vibration and natural resonance in which the maximum deflection or maximum elastic deformation occurs at a central point 24 of the cover 10. In one embodiment, the first mode has a lower frequency of natural resonance (of vibration) than the second mode and the third mode, in response to application of excitation energy within a range of approximately zero to approximately two thousand Hertz. The deformation or deflection of the cover 10 is generally elastic and does not result in permanent deformation of the cover 10. Throughout this document and the drawings, references to "deformation" shall mean generally elastic deformation. The greatest elastic deformation of the first mode occurs in an inner-most elliptical region 500 about the central point 24 of the cover 10. The lower elastic deformation of the first mode occurs in a peripheral or outermost elliptical region 512 about the central point 24 of the cover 10. Here, the greatest elastic deformation of the first mode is approximately 158 micrometers, plus or minus ten percent, and the lower elastic deformation is approximately 16 micrometers, plus or minus ten percent, where the excitation frequency (e.g., peak excitation frequency) of vibration (e.g., from the ground of ground engaging vehicle) is around 170 Hertz, plus or minus ten percent, for example. The intermediate elliptical regions 504 have elastic deformations intermediate between the greatest elastic deformation of the first mode and the lesser elastic deformation of the first mode. It should be noted that the cover 10 also can vibrate with lesser deformations (not shown) than the lower elastic deformation between the outer-most elliptical region 512 and the perimeter region 26, but the magnitude of the vibration or deformation is not generally material to dampening of the vibration of the electronic device 12.

Each elliptical region is associated with a corresponding elastic deformation range in FIG. 5A. The elastic deformation range of the inner-most elliptical region 500 is labeled as Deformation Range A (e.g., 140-158 micrometers (μm)) in FIG. 5A. As illustrated, Deformation Range B, C, D, E, F, G and H are progressively lower deformation ranges than Deformation Range A.

In FIG. 5B, the cover 10 has a second mode of vibration and natural resonance in which the maximum elastic deflection occurs at two deflection points 28 along a longitudinal axis 30 and spaced approximately equidistant from the central point 24 of the cover 10. In one embodiment, the second mode has a higher frequency of natural resonance (of vibration) than the first mode and a lower frequency of natural resonance than the third mode, in response to application of excitation energy within a range of approximately zero to approximately two thousand Hertz.

The greatest or greater elastic deformation of the second mode occurs in dual inner-most elliptical regions 502 about deflection points 28 of the cover 10. The lesser elastic deformations of the second mode occur in the peripheral or outer-most elliptical regions 514 about the deflection points 28 of the cover 10. Here, the greater elastic deformation of the second mode is approximately 151 micrometers, plus or minus ten percent, and the lesser elastic deformation is approximately 17 micrometers, plus or minus ten percent, where the excitation frequency (e.g., peak excitation frequency) of vibration (e.g., from the ground of ground engaging vehicle) is around 240 Hertz, plus or minus ten percent, for example. The intermediate elliptical regions 506 have deformations intermediate between the greater elastic deformation of the second mode and the lesser elastic deformation of the second mode.

Each elliptical region is associated with a corresponding deformation range in FIG. 5B. The elastic deformation range of the inner-most elliptical region 502 is labeled as Deformation Range A (e.g., 134-151 micrometers (μm)) in FIG. 5B. As illustrated, Deformation Range B, C, D, E, F, G and H are progressively lesser deformation ranges than Deformation Range A.

It should be noted that the cover 10 also can vibrate with lower deformations (not shown) than the lower elastic deformation between the outer-most elliptical region 512 and the perimeter region 26, but the magnitude of the vibration and associated deformation is not generally material to dampening of the vibration of the electronic device 12.

In FIG. 5C, the cover 10 has a third mode of vibration and natural resonance in which the maximum deflection occurs at two deflection points 29 along a transverse axis 32 and spaced approximately equidistant from the central point 24 of the cover 10. In one embodiment, the third mode has a higher frequency of natural resonance (of vibration) than the first mode and a higher frequency of natural resonance than the second mode, in response to application of excitation energy within a range of approximately zero to approximately two thousand Hertz.

The greater maximum elastic deformation of the third mode occurs in the dual inner-most elliptical regions 600 about the deflection points 29 of the cover 10. The lesser elastic deformation of the third mode occurs in a peripheral or outer-most elliptical region 612 about the deflection points 29 of the cover 10. Here, the greater elastic deformation of the third mode is approximately 147 micrometers, plus or minus ten percent, and the lesser elastic deformation is approximately 17 micrometers, plus or minus ten percent where the excitation frequency of vibration (e.g., from the ground of ground engaging vehicle) is around 380 Hertz, plus or minus ten percent, for example. The intermediate elliptical regions 604 have deformations intermediate between the greater elastic deformation of the third mode and the lesser elastic deformation of the third mode.

Each elliptical region is associated with a corresponding deformation range in FIG. 5C. The deformation range of the inner-most elliptical region 502 is labeled as Deformation Range A (e.g., 130-147 micrometers (μm)) in FIG. 5C. As illustrated, Deformation Range B, C, D, E, F, G and H are progressively lower deformation ranges than Deformation Range A.

It should be noted that the cover 10 also can vibrate with lesser deformations (not shown) than the lower elastic deformation between the outer-most elliptical region 612 and the perimeter region 26, but the magnitude of the vibration is not generally material to dampening of the vibration of the electronic device 12.

The cover 10 or housing member is configured with the elevated pattern 16 to dampen vibration encountered by the electronic device in on-road ground vehicle applications, off-road ground vehicle applications or otherwise. The elevated pattern 16 dampens vibrations by reducing the amplitude of elastic deformation of the cover 10, for example. Further, the cover 20 may have vibrational modes that are tuned, via the arrangement of the elevated pattern 16, to dissipate vibrational energy and to increase the natural frequency of resonance over that of a cover or housing member having a generally planar surface. The cover 10 and electronic device 12 provides increased resistance to vibrational shock and damage in off-road vehicular environment and the on-road vehicular applications. The natural vibrational frequency in the first mode, the second mode and the third mode is increased over corresponding vibrational modes associated with a generally planar or flat cover to reduce materially the vibrational energy that needs to be dissipated.

In addition, the improved vibrational resistance of the electronic device to external shock and vibration associated with a ground-engaging vehicle, the cover 10 and electronic device 12 provide improved thermal dissipation associated with the radial ribs and elliptical elevations of the cover 10.

The reduced vibration and thermal dissipation supports the longevity and reliable operation of the electronic and electrical components (e.g., components 76) and circuitry. Further, the height or profile of the housing (e.g., housing 42) with a cover 10 mounted on the housing can be minimized by minimizing or reducing the clearance between the circuit board (e.g., circuit board 44) and interior side or interior surface the cover 10 that would otherwise be necessary (e.g., to prevent contact between the cover 10 and the circuit board 44 or components thereon 78) without the designed maximum deflection and vibrational characteristics of the cover 10 in one or more vibrational modes.

Having described the preferred embodiment, it will become apparent that various modifications can be made without departing from the scope of the invention as defined in the accompanying claims.

The following is claimed:

1. A cover for attachment to an electronic device, the cover comprising:
 a central region comprising an elevated pattern of radial ribs and elliptical elevations elevated above a generally planar lower surface of a cover exterior, such that the cover has multiple vibrational modes of natural resonance in which a maximum deflection of the cover occurs in a first mode at a central point of the cover; and
 a perimeter region surrounding the central region, wherein the first mode has a lower frequency of natural resonance of vibration than other modes, among the multiple vibrational modes.

2. The cover according to claim 1 wherein the cover has a second mode of natural resonance in which the maximum deflection occurs at two deflection points along a longitudinal axis of the cover and spaced approximately equidistant from the central point of the cover.

3. The cover according to claim 2 wherein the first mode has a lower frequency of natural resonance than that of the second mode.

4. The cover according to claim 1 wherein the cover has a third mode of natural resonance in which the maximum deflection occurs at two deflection points along a transverse axis of the cover and spaced approximately equidistant from the central point of the cover.

5. The cover according to claim 4 wherein the first mode has a lower frequency of natural resonance than that of the third mode.

6. The cover according to claim 1 wherein the elevated pattern is formed by stamping a generally planar sheet metal with or against a die.

7. The cover according to claim 1 wherein the central region is generally rectangular.

8. The cover according to claim 1 wherein the perimeter region has a step and a mating flange for mating with the electronic device.

9. The cover according to claim 8 wherein the edge of the perimeter region terminates in a lip extending in an opposite direction from the elevated pattern.

10. The cover according to claim 1 wherein the radial ribs and elliptical elevations are within a range of approximately 1 millimeter to approximately 3 millimeters above the generally planar lower surface.

11. An electronic device comprising:
 a housing having at least one open side;
 a circuit board secured within the housing;
 a cover for mating with the open side and spaced apart from the circuit board by a clearance distance, the cover comprising:
 a central region comprising an elevated pattern of radial ribs and elliptical elevations elevated above a generally planar lower surface of a cover exterior, such that the cover has multiple vibrational modes of natural resonance in which a maximum deflection of the cover occurs in a first mode at a central point of the cover and wherein the maximum deflection is less than the clearance distance; and
 a perimeter region surrounding the central region, wherein the first mode has a lower frequency of natural resonance of vibration than other modes, among the multiple vibrational modes.

12. The electronic device according to claim 11 wherein the cover has a second mode of natural resonance in which the maximum deflection occurs at two deflection points along a longitudinal axis of the cover and spaced approximately equidistant from the central point of the cover.

13. The electronic device according to claim 12 wherein the first mode has a lower frequency of natural resonance than that of the second mode.

14. The electronic device according to claim 11 wherein the cover has a third mode of natural resonance in which the maximum deflection occurs at two deflection points along a transverse axis of the cover and spaced approximately equidistant from the central point of the cover.

15. The electronic device according to claim 14 wherein the first mode has a lower frequency of natural resonance than that of the third mode.

16. The electronic device according to claim 11 wherein the elevated pattern is formed by stamping a generally planar sheet metal with or against a die.

17. The electronic device according to claim 11 wherein the central region is generally rectangular.

18. The electronic device according to claim 11 wherein the perimeter region has a step and a mating flange for mating with the electronic device.

19. The electronic device according to claim 18 wherein the edge of the perimeter region terminates in a lip extending in an opposite direction from the elevated pattern.

20. The electronic device according to claim 11 wherein the radial ribs and elliptical elevations are within a range of approximately 1 millimeter to approximately 3 millimeters above the generally planar lower surface.

* * * * *